United States Patent
Leirer et al.

(10) Patent No.: US 10,340,430 B2
(45) Date of Patent: Jul. 2, 2019

(54) OPTOELECTRONIC LAMP DEVICE AND METHOD OF PRODUCING SAME

(71) Applicant: OSRAM Opto Semiconductors GmbH, Regensburg (DE)

(72) Inventors: Christian Leirer, Regensburg (DE); Björn Hoxhold, Sinzing Viehhausen (DE); Stefanie Rammelsberger, Zeitlarn (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/740,999

(22) PCT Filed: Jun. 27, 2016

(86) PCT No.: PCT/EP2016/064830
§ 371 (c)(1),
(2) Date: Dec. 29, 2017

(87) PCT Pub. No.: WO2017/001327
PCT Pub. Date: Jan. 5, 2017

(65) Prior Publication Data
US 2018/0198044 A1    Jul. 12, 2018

(30) Foreign Application Priority Data

Jun. 29, 2015   (DE) .................. 10 2015 110 429

(51) Int. Cl.
| H01L 33/60 | (2010.01) |
| H01L 33/46 | (2010.01) |
| H01L 33/48 | (2010.01) |
| H01L 33/62 | (2010.01) |
| H01L 33/52 | (2010.01) |
| H01L 21/56 | (2006.01) |

(52) U.S. Cl.
CPC .............. *H01L 33/60* (2013.01); *H01L 33/46* (2013.01); *H01L 33/486* (2013.01); *H01L 33/52* (2013.01);
(Continued)

(58) Field of Classification Search
CPC ......... H01L 21/568; H01L 2224/04105; H01L 2224/19; H01L 2224/24; H01L 2224/82;
(Continued)

(56) References Cited

U.S. PATENT DOCUMENTS

| 7,803,663 B2 * | 9/2010 | Tiziani ................ G06K 19/077 |
| | | 257/E21.599 |
| 7,838,331 B2 * | 11/2010 | Komura ............... B23K 26/009 |
| | | 438/106 |

(Continued)

FOREIGN PATENT DOCUMENTS

| DE | 10 2012 212 963 A1 | 2/2014 |
| DE | 10 2012 113 003 A1 | 4/2014 |

(Continued)

*Primary Examiner* — Mohammed Shamsuzzaman
(74) *Attorney, Agent, or Firm* — DLA Piper LLP (US)

(57) ABSTRACT

An optoelectronic lamp device includes an optoelectronic semiconductor component including a top side including a light-emitting face, and a housing embedding the semiconductor component and leaving free the light-emitting face, wherein a housing face is coated with a light-scattering dielectric resist layer that may scatter light incident on a face of the resist layer facing away from the housing face.

9 Claims, 6 Drawing Sheets

(52) U.S. Cl.
CPC ............ *H01L 33/62* (2013.01); *H01L 21/568* (2013.01); *H01L 2224/04105* (2013.01); *H01L 2224/19* (2013.01); *H01L 2224/24* (2013.01); *H01L 2224/82* (2013.01); *H01L 2224/94* (2013.01); *H01L 2933/005* (2013.01); *H01L 2933/0058* (2013.01); *H01L 2933/0066* (2013.01); *H01L 2933/0091* (2013.01)

(58) Field of Classification Search
CPC ........... H01L 2224/94; H01L 2933/005; H01L 2933/0058; H01L 2933/0066; H01L 2933/0091; H01L 33/46; H01L 33/486; H01L 33/52
See application file for complete search history.

(56) References Cited

U.S. PATENT DOCUMENTS

| | | | |
|---|---|---|---|
| 9,013,044 B2* | 4/2015 | Wood | H01L 24/11 257/774 |
| 9,721,791 B2* | 8/2017 | Briere | H01L 29/2003 |
| 9,961,777 B2* | 5/2018 | Stering | H01L 21/481 |
| 2005/0202651 A1* | 9/2005 | Akram | B28D 1/221 438/463 |
| 2013/0175573 A1* | 7/2013 | Mayer | H01L 33/44 257/103 |
| 2013/0256733 A1* | 10/2013 | Lin | H01L 33/62 257/99 |
| 2014/0334137 A1 | 11/2014 | Hasenoehrl et al. | |
| 2015/0194583 A1 | 7/2015 | Sabathil et al. | |
| 2015/0333232 A1 | 11/2015 | Preuβ et al. | |
| 2016/0118767 A1* | 4/2016 | Yoneda | H01S 5/02272 372/44.01 |
| 2016/0225942 A1 | 8/2016 | Aota et al. | |
| 2016/0293812 A1 | 10/2016 | Pindl et al. | |
| 2018/0012801 A1* | 1/2018 | Huber | H01L 33/44 |

FOREIGN PATENT DOCUMENTS

| | | |
|---|---|---|
| DE | 11 2014 004 318 T5 | 7/2016 |
| EP | 2 617 791 A1 | 7/2013 |
| WO | 2015/041007 A1 | 3/2015 |
| WO | 2015/071109 A1 | 5/2015 |

* cited by examiner

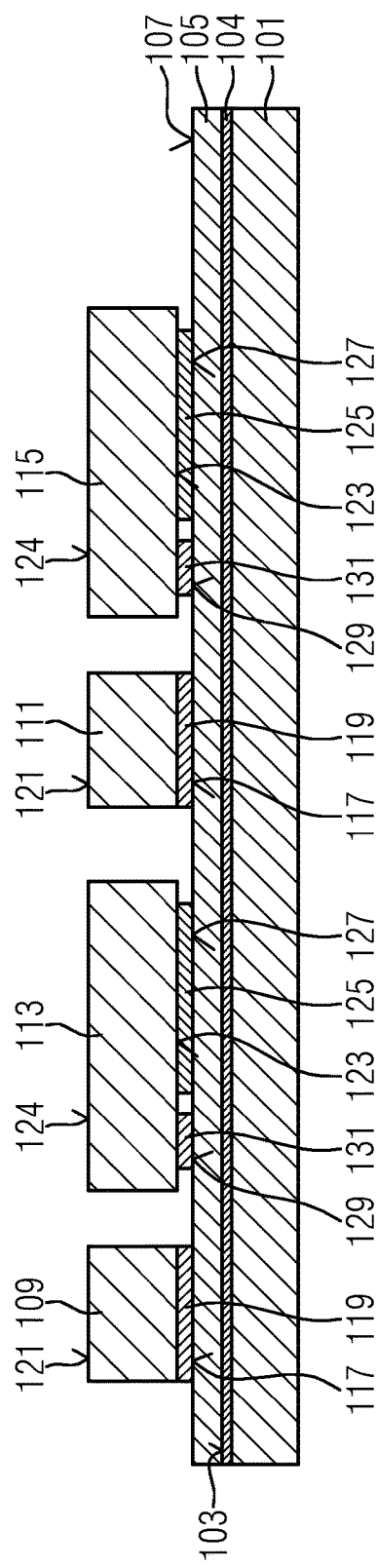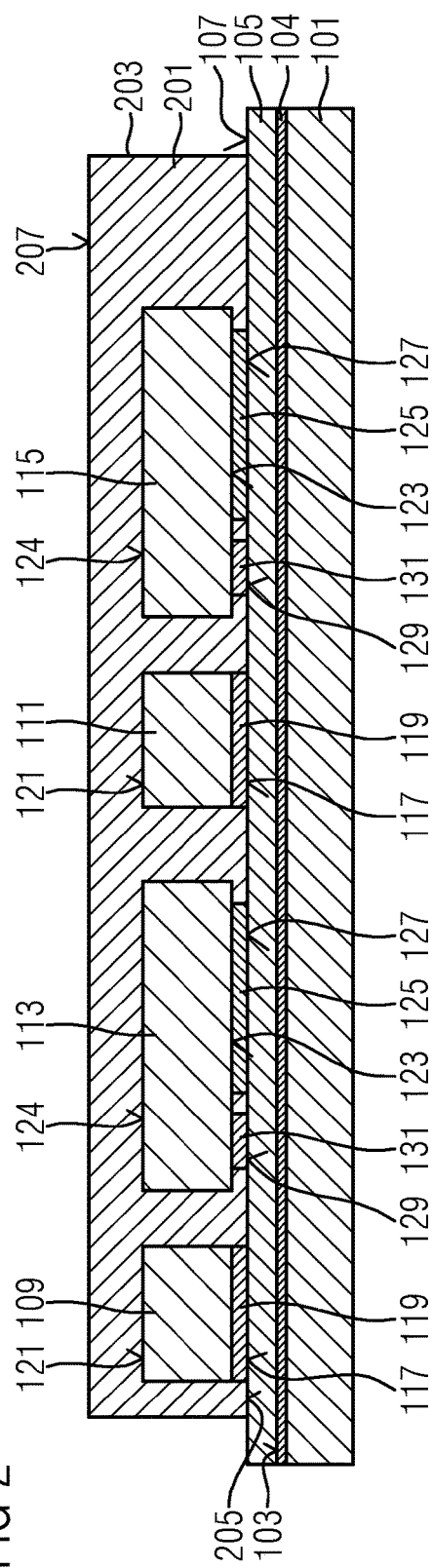

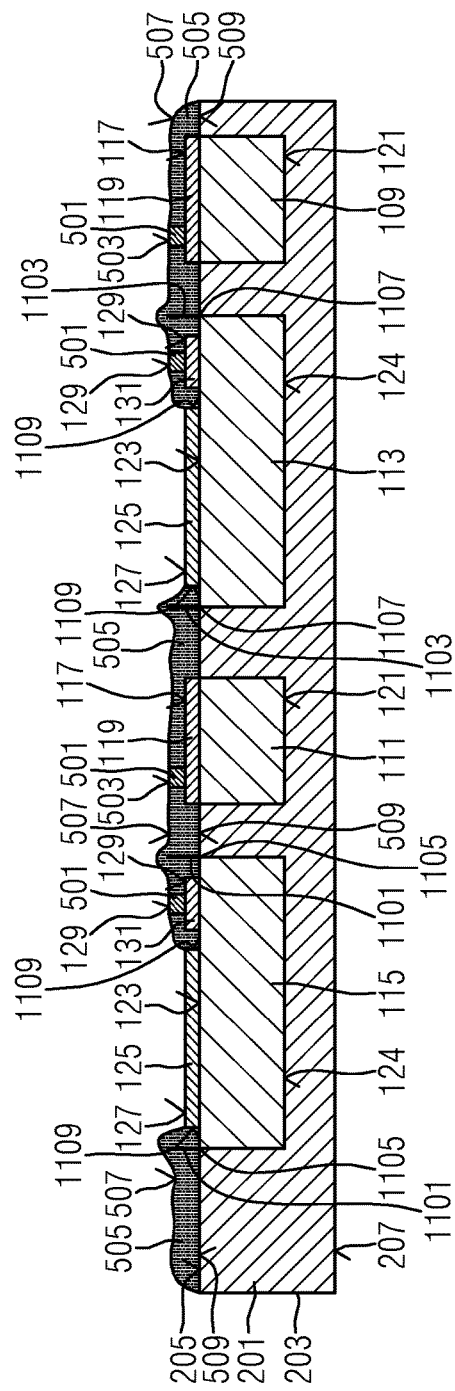

OPTOELECTRONIC LAMP DEVICE AND METHOD OF PRODUCING SAME

TECHNICAL FIELD

This application relates to an optoelectronic lamp device and a method of producing an optoelectronic lamp device.

BACKGROUND

In oWLP components (oWLP: "optical Wafer Level Package") the surface outside the LED chip is usually completely or partly covered with a dielectric and a metallization applied thereon. The metallizations often comprise a non-optimum reflectivity. Likewise, uncovered regions, that is to say regions where either the dielectric or the underlying black mold material is exposed, comprise a non-optimum reflectivity.

It is possible to cover the uncovered regions by a metal. However, this leads to high metal consumption. Furthermore, in a metal surface it is not possible to achieve an optimum reflectivity in conjunction with corrosion resistance of the surface. Moreover, the reflective surface may not be brought arbitrarily close to an edge of the light-emitting chip face.

It is also possible, by a further process step at the end of the process chain, to apply a silicone layer comprising a diffusor on the uncovered regions. However, this necessitates an additional process step and, in association with lateral patterning of a conversion layer, is difficult to realize and may cost efficiency.

It could therefore be helpful to provide an efficient way to overcome known disadvantages and thus enable an improved optoelectronic lamp device and an improved method of producing an optoelectronic lamp device.

SUMMARY

We provide an optoelectronic lamp device including an optoelectronic semiconductor component including a top side including a light-emitting face, and a housing embedding the semiconductor component and leaving free the light-emitting face, wherein a housing face is coated with a light-scattering dielectric resist layer that may scatter light incident on a face of the resist layer facing away from the housing face.

We also provide a method of producing an optoelectronic lamp device including providing an optoelectronic semiconductor component including a top side including a light-emitting face, wherein the semiconductor component is embedded in a housing leaving free the light-emitting face, and coating a housing face with a light-scattering dielectric resist such that a light-scattering dielectric resist layer coating the housing face is formed, which resist layer may scatter light incident on a face of the resist layer facing away from the housing face.

BRIEF DESCRIPTION OF THE DRAWINGS

FIGS. 1 to 9 each show a step in a method of producing an optoelectronic lamp device.

FIGS. 11 and 12 each show a step corresponding to the steps respectively shown in FIGS. 5 and 6 in a further method of producing an optoelectronic lamp device.

LIST OF REFERENCE SIGNS

Figure 3:
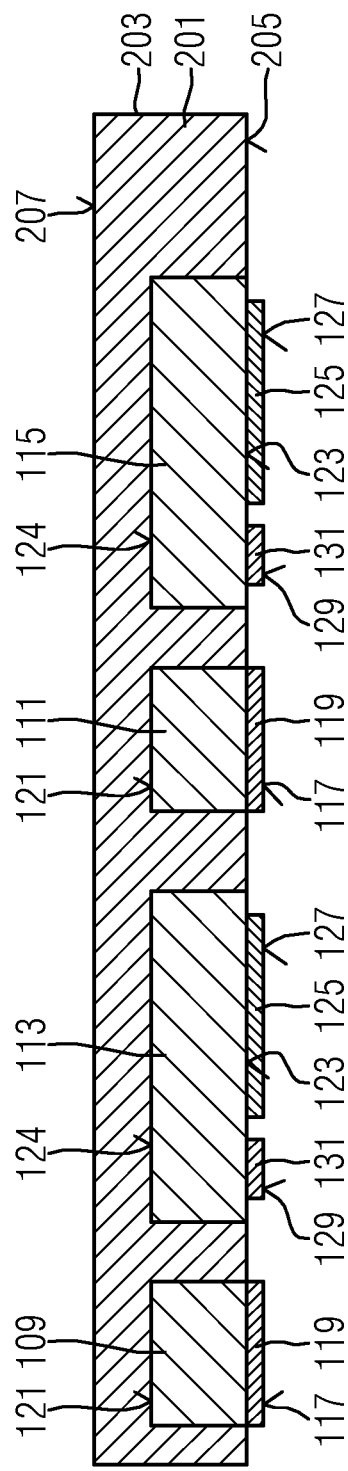

101 Carrier
103 Top side of the carrier
104 Adhesive tape
105 Adhesive layer
107 Top side of the adhesive layer
109 Plated-through hole
111 Plated-through hole
113 Optoelectronic semiconductor component
115 Optoelectronic semiconductor component
117 Top side of the plated-through hole
119 Metal coating
121 Underside of the plated-through hole
123 Top side of the semiconductor component
124 Underside of the semiconductor component
125 Epi
127 Light-emitting face
129 Electrical contact pad of the soldering pad
131 Soldering pad
201 Mold material
203 Housing
205 Top side of the housing
207 Underside of the housing
501 Electrical contact section
503 Electrical contact pad of the metal coating
505 Resist layer
507 Top side of the resist layer
509 Underside of the resist layer
601 Electrical connection
603 Housing section to be removed
701 Metallization
703 Metallization
801 Conversion layer
901 Optoelectronic lamp device
903 Optoelectronic lamp device
1001 Providing
1003 Coating process
1005 Forming a resist layer
1101 Burr
1103 Burr
1105 Edge
1107 Edge
1109 Sidewall

DETAILED DESCRIPTION

Our optoelectronic lamp device comprises:
an optoelectronic semiconductor component comprising a top side comprising a light-emitting face,
a housing embedding the semiconductor component and leaving free the light-emitting face, wherein a housing face is coated with a light-scattering dielectric resist layer, which may scatter light incident on a face of the resist layer facing away from the housing face.

We also provide a method of producing an optoelectronic lamp device, comprising the following steps:
providing an optoelectronic semiconductor component comprising a top side comprising a light-emitting face, wherein the semiconductor component is embedded in a housing leaving free the light-emitting face,
coating a housing face with a light-scattering dielectric resist such that a light-scattering dielectric resist layer coating the housing face is formed, which resist layer may scatter light incident on a face of the resist layer facing away from the housing face.

This disclosure thus comprises in particular and inter alia the concept of providing a housing face with a resist layer configured both for light scattering and as a dielectric. That is to say, in particular, that the resist layer comprises a double function: a dielectric function and a light-scattering function.

On account of the dielectric function, the resist layer thus advantageously acts as an electrical insulation layer. The resist layer is thus a dielectric.

On account of the light-scattering function, the resist layer may advantageously scatter light that is incident on a face of the resist layer facing away from the housing face. Reflectivity of the lamp device may thus advantageously be increased as a result. That is to say, in particular, that light may be scattered more efficiently. In particular, a homogeneous color impression may advantageously be generated as a result. Consequently, in particular, an improved color homogeneity is thus advantageously brought about. The resist layer thus acts as a scattering layer, that is to say is also a scattering layer.

Furthermore, the scattering layer, that is to say the light-scattering dielectric resist layer, may advantageously be produced in a common process step with a dielectric resist layer insofar as, by a single process of applying the resist, a resist layer is formed which, as explained above, comprises a double function. That is to say that the process of forming a single layer forms both a light-scattering layer and a dielectric layer: the light-scattering dielectric resist layer. Efficient production of the lamp device is advantageously brought about as a result.

On account of the coating, a controlled and efficient covering of the housing face may advantageously be achieved with a very high accuracy.

By providing the light-scattering dielectric resist layer, a homogeneous optical impression may advantageously be brought about, for example, when the resist layer is viewed in the direction of the housing face.

The resist layer is configured, in particular, to reflect or scatter only specific wavelengths or only a specific wavelength range of incident light. When light is mentioned in the light of this description, generally an electromagnetic radiation should always be inferred as well.

The resist layer may reflect or scatter (in the case of scattering, reflection should always be inferred as well, and vice versa) light incident on its face that faces away from the housing face only in a specific wavelength range. In this regard, a specific color impression may thus advantageously arise. This is advantageous in particular for design reasons, in particular with regard to an industrial design. In particular, a specific color may be generated, for example, in accordance with the resist used.

The resist layer may comprise a plurality of scattering particles.

Advantageously, the scattering particles may efficiently reflect or scatter light, in particular, in a specific wavelength range or only at a specific wavelength. The color that is reflected and/or scattered by the scattering particles may be used as identification to designate the resist layer. When red light is scattered, the resist layer may be referred to as a red resist layer. When white light is scattered, the resist layer may be referred to as a white resist layer. In a white resist layer, in particular, it is possible to increase a luminous efficiency in a switched-off state of the optoelectronic semiconductor component.

The scattering particles may comprise one or more elements selected from the following group of scattering particles: $TiO_2$ particles, $Al_2O_3$ particles, $SiO_2$ particles, $BaSO_4$ particles, $ZrO_2$ particles, $HfO_2$ particles.

This affords the technical advantage, in particular, that an efficient scattering of light is made possible. In particular, in accordance with the scattering particles used, it is possible to accurately set what wavelength range or what wavelength of incident light is intended to be scattered or reflected.

The scattering particles may comprise, for example, a diameter of less than 10 μm, in particular less than 1 μm. Preferably, the diameter of the scattering particles is smaller than the thickness of the resist layer.

The resist layer may comprise a layer thickness of 5 μm to 25 μm. Preferably, the layer thickness of the resist layer is less than 50 μm. A minimum thickness of the resist layer depends in particular on the dielectric properties of the resist layer and is limited in particular by the dielectric properties. This is because, after all, the resist layer acts in particular as an electrical insulator.

The layer thickness of the resist layer may be 5 μm to 50 μm, in particular 10 μm to 25 μm.

The resist layer may be configured such that scattered light is white.

This affords the advantage, in particular, that a white color impression may be achieved, in particular, in a switched-off state of the optoelectronic semiconductor component. As a result, it is possible in particular to increase a luminous efficiency.

That is to say, in particular, the resist layer may be a white resist layer, that is to say scattered and/or reflected light may be white.

An electrical plated-through hole running from a top side of the housing to an underside of the housing situated opposite the top side may be embedded in the housing, the plated-through hole comprising a top side, which is partly coated by the resist layer, and an underside situated opposite the top side, wherein an electrical contact pad is configured at the top side of the plated-through hole, the electrical contact pad being free of the resist layer and electrically connected to an electrical contact pad configured at the top side of the semiconductor component.

This affords the technical advantage, in particular, that an efficient electrical contacting of the semiconductor component may be achieved. In particular, this affords the technical advantage that on account of the partial coating of the top side of the plated-through hole by the resist layer a luminous efficiency of the lamp device may be efficiently increased further. This is because the area that may scatter and/or reflect light is thus enlarged.

Since the resist layer is a dielectric resist layer, that is to say is a dielectric, a region of the top side of the plated-through hole thus has to be free of the resist layer so that the electrical connection between the plated-through hole and the contact pad of the top side of the semiconductor component is made possible.

Another structure provides for a section of the top side of the semiconductor component, which section is configured differently than the light-emitting face, to be partly coated with the resist layer.

This affords the technical advantage, in particular, that a luminous efficiency may be further increased efficiently. This is because now, in addition to the housing face, a section of the top side of the semiconductor component, which section is different from the light-emitting face, is also coated with the resist layer. An area of the resist layer is thus enlarged in an efficient manner. In this case, however, provision is made, in particular, for at least one region or one section of the top side which is different from the light-emitting face to remain free of the resist layer. This is because the region is configured in particular as an electrical contact pad to electrically contact the semiconductor component.

The section may comprise an edge of the top side of the semiconductor component. That is to say, in particular, that an edge of the top side of the semiconductor component is provided with the resist layer.

An edge of the top side of the semiconductor component may be completely provided with the resist layer.

A burr may be formed at an edge of the top side of the semiconductor component, the burr being coated with the resist layer.

Such a burr, which is electrically conductive in particular, is formed, for example, when the semiconductor component is singulated from a wafer assemblage of a plurality of semiconductor components by a laser. The burr may also be referred to as a slag burr insofar as the materials from which the semiconductor component is formed melt during laser singulation and thus locally form a slag.

The burr, since it is electrically conductive, may short-circuit the electrically conductive connection formed between the electrical contact pad formed at the top side of the plated-through hole and the electrical contact pad formed at the top side of the semiconductor component. By virtue of the fact, however, that the burr is coated with the resist layer, the burr is advantageously electrically insulated from the electrically conductive connection. A corresponding short circuit is efficiently avoided as a result.

The electrically conductive connection formed between the electrical contact pad formed at the top side of the plated-through hole and the electrical contact pad formed at the top side of the semiconductor component may be formed as a metallization applied on the resist layer.

By way of example, the resist layer applied on the burr has been and/or respectively is provided with the metallization.

The burr may be provided or coated with the resist layer, wherein the metallization is subsequently applied such that an electrically conductive connection (that is to say the electrical connection) between the electrical contact pad formed at the top side of the plated-through hole and the electrical contact pad formed at the top side of the semiconductor component forms as a result.

The burr generally comprises a height of 15 µm, for example. A height of a contact pad is generally a maximum of 4 µm, for example. The burr thus generally projects above the contact pad. In this respect, it is generally very difficult or not possible to provide a conductor track that electrically conductively connects the electrical contact pad formed at the top side of the plated-through hole to the electrical contact pad formed at the top side of the semiconductor component. This is because the burr here as it were stands in the way.

However, since the burr according to one example has been provided with the resist layer, the electrically conductive connection, that is to say the electrical connection, between the two electrical contact pads may be efficiently formed by a metallization of the resist layer.

The electrical connection between the electrical contact pad formed at the top side of the plated-through hole and the electrical contact pad formed at the top side of the semiconductor component may be configured as a conductor track. The conductor track is thus formed, for example, on the resist layer coating the burr.

The resist layer may directly adjoin the light-emitting face.

The light-emitting face is, in particular, a surface of an epitaxial layer or of an epitaxial layer stack. Such an epitaxial layer or such an epitaxial layer stack is also referred to as an Epi by those skilled in the art. "Epi" is thus an abbreviation of "epitaxial layer or epitaxial layer stack". Another term for Epi is "mesa". It is also possible to use the compound term "Epi-mesa" for "epitaxial layer" or "epitaxial layer stack".

The light-emitting face may be partly or completely coated by a conversion layer.

The light-emitting face may be free of a conversion layer.

The resist layer may directly adjoin a lateral sidewall (which, for the sake of simplicity, may also be referred to just as a sidewall) of the epitaxial layer or the epitaxial layer stack. That is to say, in particular, that the resist layer directly touches or directly contacts the lateral sidewall (sidewall) of the epitaxial layer or the epitaxial layer stack. For the term "sidewall", the plural should always be inferred as well. For example, the resist layer directly adjoins opposite sidewalls of the epitaxial layer or the epitaxial layer stack, that is to say touches or contacts them.

The resist may be a solder resist. The resist layer is thus preferably a solder resist layer.

The solder resist is, for example, a solder resist on the basis of epoxy resin. The solder resist layer is thus, for example, a solder resist layer on the basis of epoxy resin.

The solder resist comprises, for example, a plurality of scattering particles, for example, titanium dioxide ($TiO_2$) scattering particles. The solder resist layer thus comprises, for example, a plurality of scattering particles, for example, titanium dioxide ($TiO_2$) scattering particles.

The resist may comprise a photopatternable silicone and/or a photopatternable siloxane. The resist layer thus comprises in particular a photopatternable silicone and/or a photopatternable siloxane. The photopatternable silicone and/or respectively the photopatternable siloxane may comprise a plurality of scattering particles, for example, titanium dioxide ($TiO_2$) scattering particles. This affords the technical advantage, for example, that the resist layer may be efficiently processed or patterned efficiently by a photolithographic process.

The resist may be a photoresist. The resist layer is thus in particular a photoresist layer. The photoresist comprises, for example, a plurality of scattering particles, in particular titanium dioxide ($TiO_2$) scattering particles. The photoresist layer thus comprises in particular a plurality of scattering particles, in particular titanium dioxide ($TiO_2$) scattering particles. This affords the technical advantage, for example, that the resist layer may be efficiently processed or patterned efficiently by a photolithographic process.

The resist layer may be patterned after the coating process. The resist layer is thus preferably a patterned resist layer. This affords the technical advantage, for example, that the resist layer may be adapted efficiently for a concrete application.

Patterning may comprise a photolithographic patterning. The resist layer is thus, for example, a photolithographically patterned resist layer. This affords the technical advantage, for example, that the resist layer may be patterned efficiently.

A lithographic patterning of the resist layer furthermore comprises the advantage that the resist layer may be processed efficiently over a large area.

The exemplary coating methods described below are suitable in particular in an advantageous manner for applying the resist efficiently of a large area.

A patterned resist layer may be applied by screen printing using a patterned screen. That is to say, in particular, that the structures of the resist layer are applied by a patterned screen during screen printing. This affords the technical advantage, for example, that an expensive lithography process may be dispensed with. Although screen printing using a patterned screen may not be quite as precise as a lithography process, nevertheless screen printing is advantageous for applications in which the costs are of considerable importance.

Furthermore, materials that are not lithographically patternable may be applied as resist by such screen printing. This affords the technical advantage, in particular, that a greater possibility for selection in the materials for the resist layer is provided compared to a lithography process.

The coating process may comprise screen printing of the resist layer. The resist is thus applied, for example, by screen printing. The resist layer is thus in particular a screen-printed resist layer. This affords the technical advantage, in particular, that the coating process may be carried out efficiently. The screen printing is carried out, for example, using a patterned screen, as described above.

The coating process may comprise curtain coating of the resist layer. The resist is thus applied, for example, by curtain coating. The resist layer is thus, for example, a curtain-coated resist layer. This affords the technical advantage, for example, that the coating process may be carried out efficiently.

The coating process may comprise spin coating of the resist layer. The resist is thus applied by spin coating, in particular. The resist layer is thus in particular a spin-coated resist layer. This affords the technical advantage, for example, that the coating process may be carried out efficiently.

The coating process may comprise spraying of resist. The resist layer is thus in particular a sprayed resist layer. This affords the technical advantage, for example, that the coating process may be carried out efficiently.

As described by way of example above, the resist may thus be applied in an unpatterned fashion to form an unpatterned resist layer, wherein the unpatterned resist layer is patterned after application, for example, by a lithography process. For example, the resist may be applied in a patterned fashion such that a patterned resist layer is formed directly, which thus no longer need be patterned after application.

The optoelectronic lamp device may be and/or respectively is produced by the method of producing an optoelectronic lamp device.

Examples relating to the method are analogously evident from examples relating to the optoelectronic lamp device, and vice versa. That is to say that technical functionalities of the method are analogously evident from corresponding technical functionalities of the optoelectronic lamp device. Explanations given in association with the method are analogously applicable to the optoelectronic lamp device, and vice versa.

One or more elements from the following group of scattering particles may be selected as scattering particles: $TiO_2$ particles, $Al_2O_3$ particles, $SiO_2$ particles, $BaSO_4$ particles, $ZrO_2$ particles, $HfO_2$ particles.

The resist layer may be configured such that scattered light is white.

An electrical plated-through hole running from a top side of the housing to an underside of the housing situated opposite the top side may be embedded in the housing, the plated-through hole comprising a top side and an underside situated opposite the top side, wherein the top side of the plated-through hole is partly coated by the resist such that the top side of the plated-through hole is partly coated by the resist layer, wherein an electrical contact pad is configured at the top side of the plated-through hole, the electrical contact pad being free of the resist layer and electrically connected to an electrical contact pad configured at the top side of the semiconductor component.

A section of the top side of the semiconductor component, which section is configured differently from the light-emitting face, may be partly coated by the resist such that that section of the semiconductor component configured differently from the light-emitting face is coated by the resist layer.

The element or elements may be embedded or arranged onto a carrier before the embedding, wherein the embedding comprises the fact that the element or elements arranged on the carrier is or are encapsulated by molding by a mold material such that the housing is formed by the mold material, wherein after the molding the carrier is removed from the element or elements encapsulated by molding such that a housing molded from the mold material is provided in which the element or elements to be embedded is or are embedded.

A molded housing advantageously achieves the effect that the housing may be produced efficiently. Molding may be designated in particular as injection molding. That is to say in particular that the housing is injection-molded.

The housing may be an injection-molded housing.

A mold material may thus be referred to in particular as an injection-molding material. A mold material comprises in particular one or more silicones or is formed from one or more silicones.

The wording "a housing embedding the semiconductor component and leaving free the light-emitting face" means, in particular, that although the housing embeds the semiconductor component, in the process it leaves free the light-emitting face. That is to say in particular that the light-emitting face is not covered by the housing. That is to say, in particular, that the light-emitting face is uncovered.

The top side of the plated-through hole may be a metal-coated top side. That is to say in particular that the top side of the plated-through hole comprises a metal coating. That is to say in particular that according to one example, the metal coating is partly coated by the resist such that a resist layer partly coating the metal coating is formed. That is to say in particular that the resist layer partly coats the metal coating. The top side of the plated-through hole when a metal coating is present is thus the top side of the metal coating.

The electrical contact pad of the top side of the semiconductor component may comprise a metal coating. The metal coating is partly coated by the resist layer analogously to the metal coating of the plated-through hole according to one example.

The electrical connection between the electrical contact pad of the top side of the semiconductor component and the top side of the plated-through hole may be formed by an electrical connection between the metal coating of the electrical contact pad of the top side of the semiconductor component and the metal coating of the top side of the plated-through hole.

Forming the electrical connection may comprise bonding.

Forming the electrical connection may comprise a photolithographic process. That is to say that the electrical connection is, for example, a photolithographically defined electrical connection. That is to say in particular that a form of the electrical connection has been and/or respectively is predefined in particular by the photolithographic process.

The semiconductor component may be formed as a semiconductor chip.

The semiconductor component may be a light-emitting diode (LED). The light-emitting diode is preferably an inorganic diode.

The light-emitting diode may be a laser diode. The laser diode is preferably formed as a laser diode chip.

The light-emitting face may be a face of a conversion layer. That is to say, for example, that the semiconductor component may comprise a conversion layer. The top side of the semiconductor component thus comprises in particular such a conversion layer.

A conversion layer is configured, in particular, to convert electromagnetic radiation comprising a first wavelength or a first wavelength range into an electromagnetic radiation comprising a second wavelength or a second wavelength range, wherein the second wavelength is different from the first wavelength and/or respectively the second wavelength range is at least partly, in particular completely, different from the first wavelength range.

A conversion layer thus comprises a conversion function that converts electromagnetic radiation or light. The electromagnetic radiation to be converted may be designated, for example, as a primary light or as a primary radiation. The electromagnetic radiation converted by the conversion layer may be designated, for example, as a secondary light or as a secondary radiation. The semiconductor component thus emits, for example, the primary light which is converted into secondary light by the conversion layer.

The conversion layer may comprise, for example, a phosphor and/or an organic and/or an inorganic luminophore.

The wording "respectively" encompasses in particular the wording "and/or".

The above-described properties, features and advantages and the way in which they are achieved will become clearer and more clearly understood in association with the following description of the examples explained in greater detail in association with the drawings.

Hereinafter, identical reference signs may be used for identical features.

FIG. 1 shows a first step in a method of producing an optoelectronic lamp device.

In accordance with the first step, a carrier 101 is provided. The carrier 101 comprises a top side 103. An adhesive tape 104 is arranged on the top side 103 of the carrier 101. An adhesive layer 105 is arranged on the adhesive tape 104.

The adhesive tape 104 may be, for example, an adhesive tape identified by the brand name "Revalpha".

The adhesive tape 104 is a double-sided adhesive tape in which one of the two adhesive layers loses its adhesive effect starting from a specific temperature as a result of the action of heat. The adhesive tape is thus a so-called "thermo-release" adhesive tape.

The term thermo-release film is employed in German jargon as well.

The adhesive layer comprises a top side 107 facing away from the top side 103 of the carrier 101.

Two plated-through holes 109, 111 and two optoelectronic semiconductor components 113, 115 are arranged on the top side 107 of the adhesive layer 105.

The plated-through holes 109, 111 each have a top side 117 and an underside 121 situated opposite the top side 117. The top side 117 is configured as a metal-coated or metallized top side. The corresponding metal coating is identified by the reference sign 119. The respective top side 117 faces the top side 107 of the adhesive layer 105.

The optoelectronic semiconductor components 113, 115 each have a top side 123 and an underside 124 situated opposite the top side. The respective top side 123 faces the top side 107 of the adhesive layer 105.

The respective top side 123 of the semiconductor components 113, 115 each comprises an Epi 125 comprising a light-emitting face 127. In one example, the light-emitting face is partly or completely coated by a conversion layer. The Epi 125 is, for example, free of a conversion layer.

During operation of the two semiconductor components 113, 115 light or generally electromagnetic radiation is emitted by the light-emitting face 127.

An electrical contact pad 129 comprised by a soldering pad 131 is each formed at the respective top side 123 of the semiconductor components 113, 115. The respective soldering pad 131 is formed or arranged at the top side 123 of the two semiconductor components 113, 115. Consequently, an electrical contact pad 129 is configured indirectly at the respective top side 123.

The two optoelectronic semiconductor components 113, 115 and the two plated-through holes 109, 111 that generally, for example, may be formed from copper or may comprise copper, are encapsulated by molding or encapsulated by injection molding in a molding process or an injection molding process. This is shown symbolically in FIG. 2.

Thus, a subsequent step provides for the semiconductor components 113, 115 and the plated-through holes 109, 111 to be encapsulated by molding by a mold material 201. The encapsulation by molding results in formation of a housing 203. The housing 203 thus embeds the plated-through holes 109, 111 and the semiconductor components 113, 115. In this case, however, a respective top side 117, 123 of the individual embedded elements 109, 111, 113, 115 remains free.

The housing 203 comprises a top side 205 facing the top side 103 of the carrier 101. The housing 203 comprises an underside 207 situated opposite the top side 205 of the housing 203.

The plated-through holes 109, 111 and the optoelectronic semiconductor components 113, 115 face the top side 103 of the carrier 101 with their respective top side 117, 123 when the plated-through holes 109, 111 and the semiconductor components 113, 115 are arranged on the carrier 101, that is to say are fixedly adhesively bonded on the top side 103 of the carrier 101 by the adhesive layer 105 and the adhesive tape 104.

After molding the housing 203, a further step of the method provides for the carrier 101 together with the adhesive layer 105 and the adhesive tape 104 to be removed from the housing 203 and the plated-through holes 109, 111 and the semiconductor components 113, 115. FIG. 3 shows the arrangement in accordance with FIG. 2 with the carrier 101 removed and the adhesive layer 105 removed and the adhesive tape 104 removed. In addition, superfluous mold material 201 that settled, for example, between the soldering pad 131 and the Epi 125 has also been removed.

Consequently, the two plated-through holes 109, 111 are embedded in the housing 203 such that only the metal coating 119 is still uncovered. The metal coating 119 as it were looks out from the housing 203. It thus projects from the housing 203 beyond the top side 205 of the housing 203. This analogously applies to the soldering pads 131 and also the Epi 125.

Figure 4:
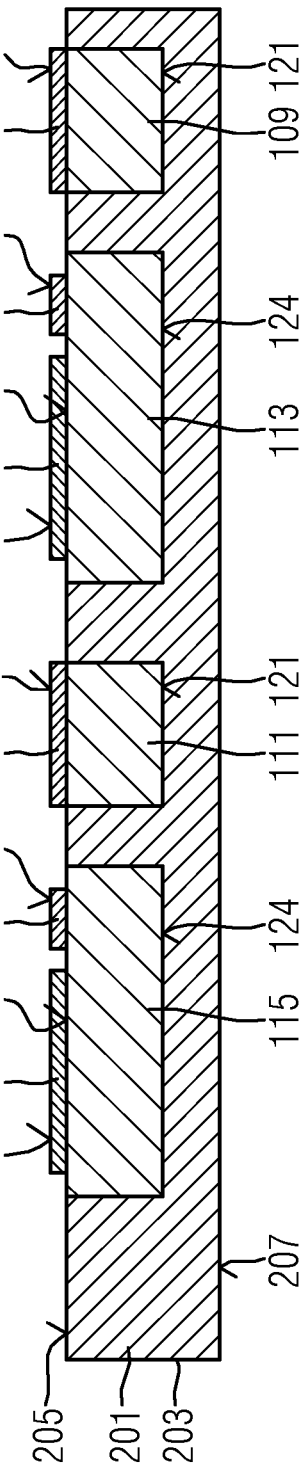

FIG. 4 shows the arrangement in accordance with FIG. 3, the arrangement having been rotated by 180°. Consequently, the respective top sides 117, 123 then face upward relative to the plane of the drawing.

Preferably photolithographic processing processes and/or sputtering processes and/or metallization processes and/or etching processes then take place on the top sides 117, 123. This is shown symbolically in FIG. 5. On account of these processes, electrically elevated contact sections 501 are formed, for example, on the soldering pads 131. "Elevated" here means relative to a surface of the soldering pads 131. The electrical contact pad 129 is thus configured at a side of the contact sections 501 facing away from the top side 123 of the semiconductor components 113, 115. Consequently, an electrical contact pad 129 is configured indirectly at the respective top side 123.

Such elevated electrical contact sections 501 are likewise formed on the metal coating 119, wherein here the electrical contact sections 501 comprise an electrical contact pad 503 facing away from the top side 117 of the plated-through holes 109, 111. Consequently, an electrical contact pad 503 is each configured indirectly at the top sides 117 of the plated-through holes 109, 111.

Furthermore, provision is made for the top side 205 of the housing 203 to be treated with a resist such that a resist layer 505 is formed. Since the top side 205 is a housing face, a housing face of the housing 203 is thus coated with a resist. That is to say in particular that, for example, uncovered regions or sections of the top side 205 of the housing 203 can be coated with a resist such that a resist layer 505 is correspondingly formed here. The resist layer 505 comprises a top side 507. The resist layer 505 furthermore comprises an underside 509 facing away from the top side 507. The underside 509 of the resist layer 505 faces the top side 205 of the housing 203.

The resist is a dielectric resist and comprises a plurality of scattering particles. Consequently, the resist layer 505 is a light-scattering dielectric resist layer. Light incident on the top side 507 of the resist layer 505 is thus scattered and/or reflected. The top side 507 of the resist layer 505 faces away from the top side 205 of the housing 203. Since the top side 507 of the resist layer 505 is a face, light incident on a face, that is to say the top side 507 of the resist layer 505 facing away from the top side 205, that is to say the housing face, is thus scattered and/or reflected by the resist layer 505.

Further sections of uncovered faces may be coated with the resist such that the resist layer 505 is correspondingly formed here as well. The uncovered faces are, for example, partial faces of the top side 123 of the semiconductor components 113, 115, that are different from the light-emitting face 127. In particular, the top sides 117 of the plated-through holes 109, 111 can be partly coated with the resist, wherein here at least one region remains free of the resist to configure the electrical contact section 501 here. The same applies to the soldering pad 131. Here, too, a section must remain free of a resist to correspondingly configure the electrical contact section 501 here.

A reflective resist may be involved. The resist layer 505 preferably comprises a layer thickness of 5 µm to 50 µm, in particular 10 µm to 25 µm. The resist layer 505 covers in particular an edge 1105 of the top side 123 of the semiconductor component 115 and also in particular an edge 1107 of the top side 123 of the semiconductor component 113. The resist layer 505 contacts directly opposite side walls 1109 of the Epi 125.

The plated-through holes 109, 111 are then electrically connected to the optoelectronic semiconductor components 113, 115. The plated-through hole 109 may be electrically connected to the semiconductor component 113. The plated-through hole 111 electrically connects to the optoelectronic semiconductor component 115. In this case, an electrical connection may be formed between the respective electrical contact pad 129 and the respective electrical contact pad 503.

Figure 6:
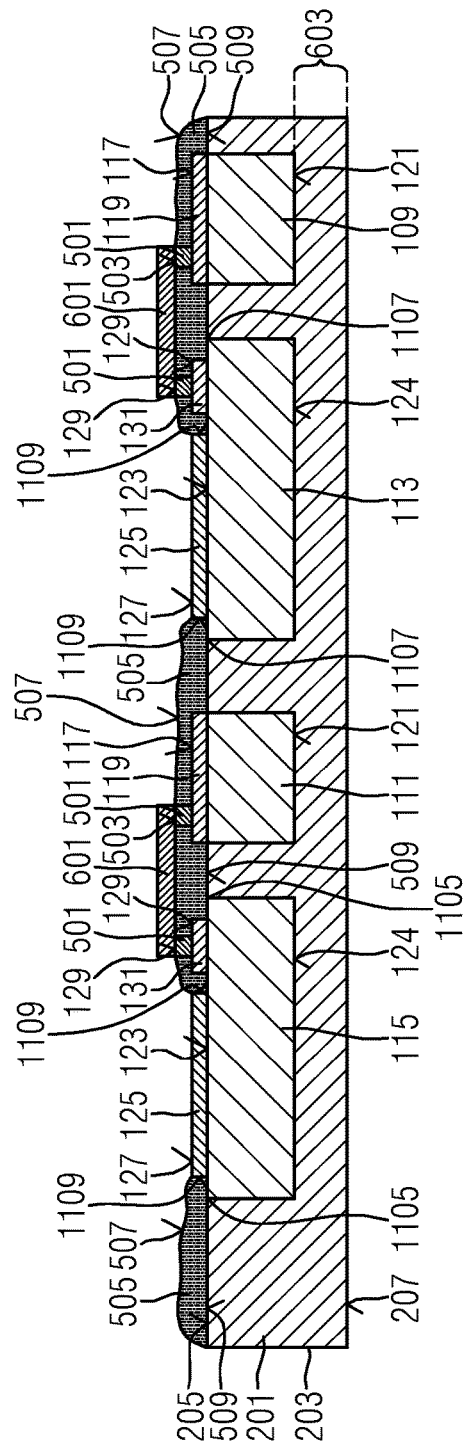

This is illustrated symbolically in FIG. 6. The electrical connection is identified here by the reference sign 601. According to one example, the electrical connection 601 may be a bond wire. In a further example, the electrical connection 601 may have been and/or respectively be defined by a photolithographic process.

FIG. 6 depicts a curly bracket with the reference sign 603 that identifies a housing section to be removed of the housing 203. That is to say that this housing section 603 will be removed to uncover the undersides 121 of the plated-through holes 109, 111 and the undersides 124 of the semiconductor components 113, 115.

Removing the housing section 603 may comprise, for example, grinding and/or sawing.

Figure 7:
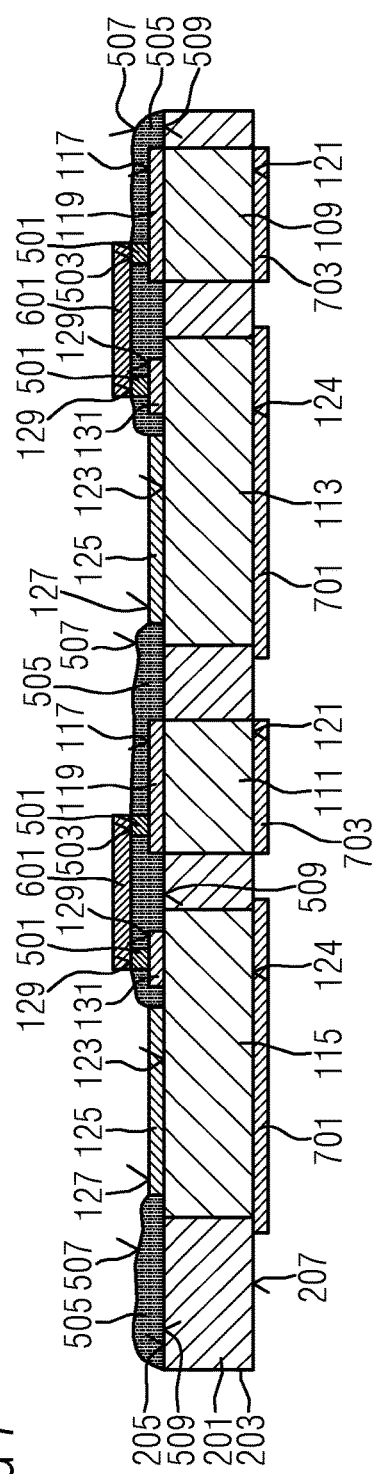

FIG. 7 shows the arrangement in accordance with FIG. 6 with the housing section 603 removed. That is to say that the arrangement in accordance with FIG. 7 no longer shows the housing section 603. That is to say that the housing 203 shown in FIG. 7 no longer comprises the housing section 603 in accordance with FIG. 6. The undersides 121 of the plated-through holes 109, 111 and also the undersides 124 of the semiconductor components 113, 115 are thus uncovered.

The plated-through holes 109, 111 thus run from the top side 205 of the housing 203 through the housing 203 to the underside 207 of the housing 203 now that the housing section 603 has been removed.

Consequently, what is advantageously made possible and also thus provided is that the undersides 121, 124 are metallized. A metallization or a metal layer is thus formed on the undersides 121, 124. In this case, the reference sign 701 denotes a respective metallization of the underside 124 of the semiconductor components 113, 115. The reference sign 703 denotes a respective metallization of the undersides 121 of the plated-through holes 109, 111.

Consequently, the plated-through holes 109, 111 and the semiconductor components 113, 115 may be efficiently electrically conducted via the metallizations 701, 703.

The arrangement shown in FIG. 7 is also provided with a coating 801 that may be applied by spraying, for example. This is shown symbolically in FIG. 8. The coating 801 is a conversion coating. A conversion layer 801 is thus formed. By way of example, the conversion layer 801 comprises a phosphor converter embedded in a silicone matrix.

A conversion layer is configured in particular to convert electromagnetic radiation comprising a first wavelength or a first wavelength range into an electromagnetic radiation comprising a second wavelength or a second wavelength range, wherein the second wavelength is different from the first wavelength and/or respectively the second wavelength range is at least partly, in particular completely, different from the first wavelength range. A conversion layer thus comprises a conversion function, that is to say converts electromagnetic radiation. The electromagnetic radiation to be converted may be designated, for example, as a primary light or as a primary radiation. The electromagnetic radiation converted by the conversion layer may be designated, for example, as a secondary light or as a secondary radiation.

The conversion layer may comprise, for example, a phosphor and/or an organic and/or an inorganic luminophore.

Figure 8:
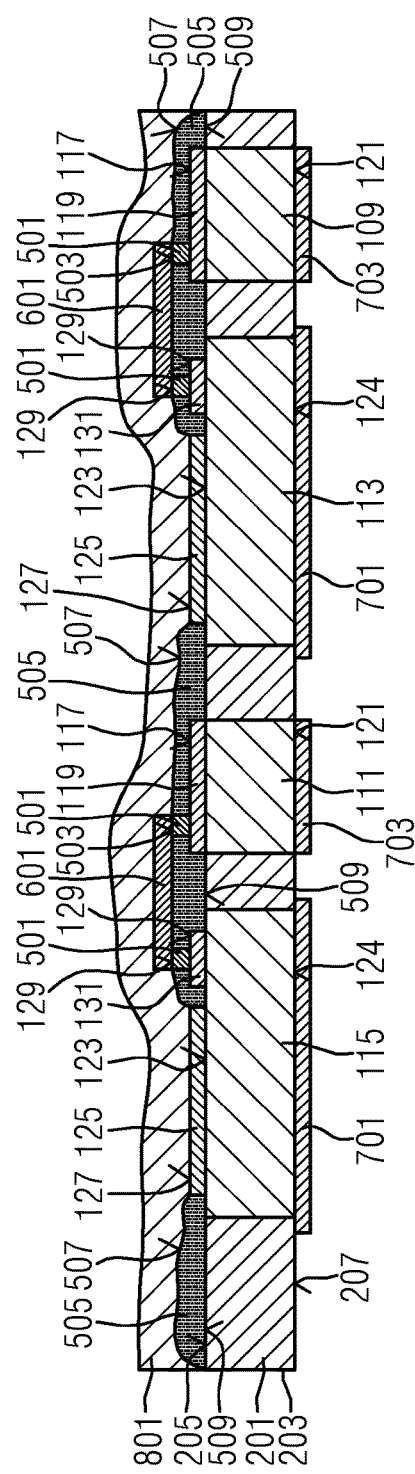
Figure 9:
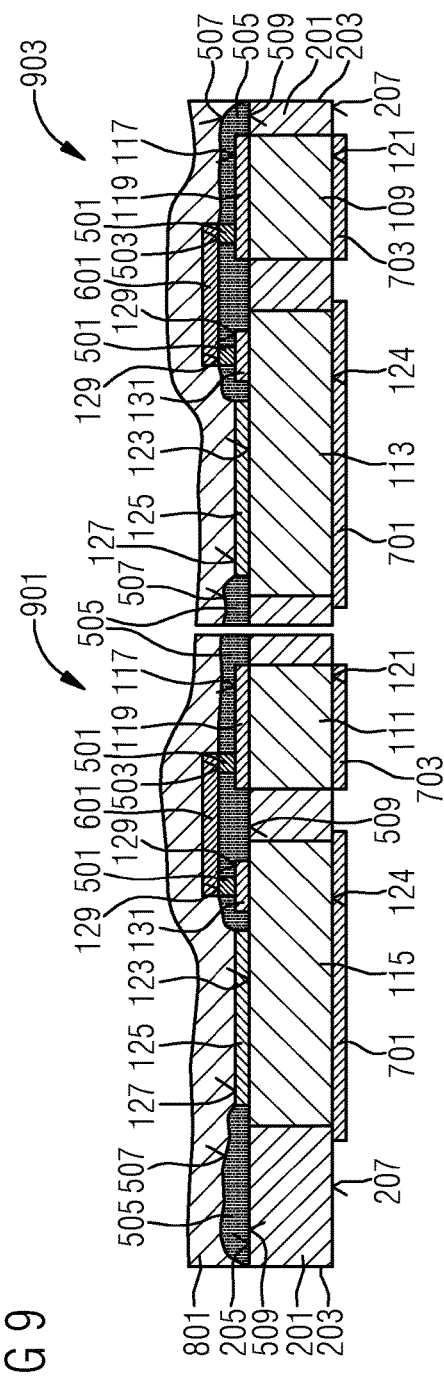

The arrangement shown in FIG. 8 is singulated such that two optoelectronic lamp devices 901, 903 are formed. This is shown symbolically in FIG. 9.

Consequently, each of the optoelectronic lamp devices 901, 903 respectively comprises a plated-through hole 109, 111 and also a semiconductor component 113, 115 and also a housing 203, in which the plated-through hole 109, 111 and the optoelectronic semiconductor component 113, 115 are embedded, wherein in particular the light-emitting faces 127 are uncovered. Furthermore, sections of faces different from the light-emitting face 127 are partly coated with the resist layer 505.

The production steps in a method of producing an optoelectronic lamp device as shown symbolically and by way of example in FIGS. 1 to 9 show two plated-through holes 109, 111 and also two optoelectronic semiconductor components 113, 115. In examples not shown, more or fewer (that is to say one) than two plated-through holes 109, 111 and more or fewer (that is to say one) than two optoelectronic semiconductor components 113, 115 may be provided that are embedded into a housing 203 analogously to the two plated-through holes 109, 111 and the two optoelectronic semiconductor components 113, 115. Correspondingly, a singulation may then take place to form more than two optoelectronic lamp devices. Moreover, in further examples not shown, a plurality of semiconductor components may be assigned and correspondingly a plurality of plated-through holes may be assigned to one optoelectronic lamp device.

Figure 10:
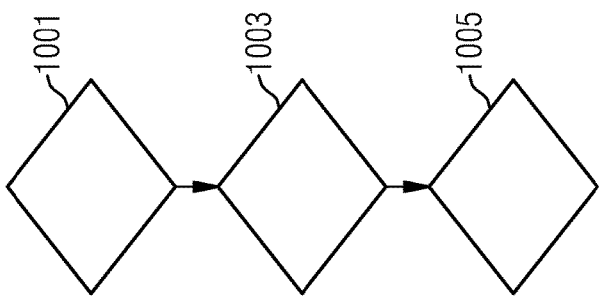
FIG. 10 shows a flow diagram of a method of producing an optoelectronic lamp device.

FIG. 10 shows a flow diagram of a method of producing an optoelectronic lamp device.

The method comprises the following steps:
providing 1001 an optoelectronic semiconductor component comprising a top side comprising a light-emitting face, wherein the semiconductor component is embedded in a housing leaving free the light-emitting face,
coating 1003 a housing face with a light-scattering dielectric resist such that a light-scattering dielectric resist layer coating the housing face is formed 1005, which resist layer may scatter light incident on a face of the resist layer facing away from the housing face.

Figure 5:
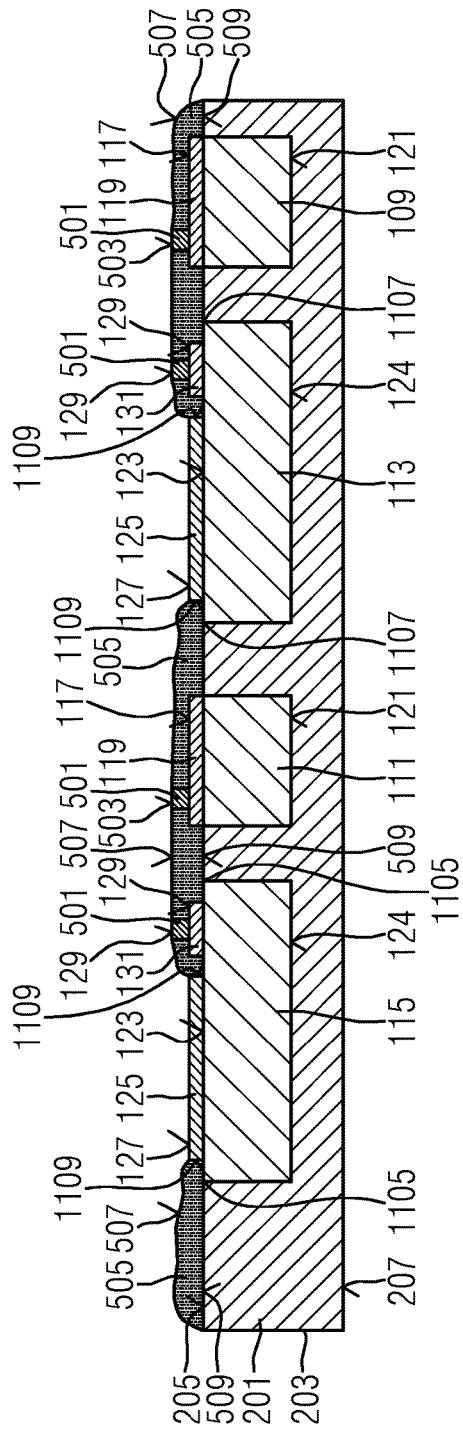

FIGS. 11 and 12 each show a step corresponding to the steps respectively shown in FIGS. 5 and 6 in a further method of producing an optoelectronic lamp device.

Identical reference signs are therefore used for identical features. As a difference here the semiconductor components comprise burrs, which will be described in even further detail below. However, the steps preceding FIG. 5 and the steps succeeding FIG. 6 are analogously applicable to the semiconductor components comprising burrs as shown in FIGS. 11 and 12.

The semiconductor component 115 comprises a burr 1101. The semiconductor component 113 likewise comprises a burr 1103.

The burr 1101 of the semiconductor component 115 is formed at an edge 1105 of the top side 123 of the semiconductor component 115.

The burr 1103 of the semiconductor component 113 is formed at an edge 1107 of the top side 123 of the semiconductor component 113.

The burrs 1101, 1103 arise, for example, during singulation of the semiconductor components 113, 115. The burrs 1101, 1103 comprise a height (for example, 14 µm), that is greater than the height (for example, a maximum of 4 µm) of the electrical contact pad 129 of the soldering pad 131.

The burrs 1101, 1103 are completely covered by the resist layer 501 such that the burrs 1101, 1103 are completely embedded in the resist layer.

The electrical connection 601 is formed on the resist layer 501 embedding the burrs 1101, 1103, for example, as a metallization. On account of the resist layer 501, the electrical connection 601 is not short-circuited by the burrs 1101, 1103. The burrs 1101, 1103 are thus electrically insulated from the electrical connection 601.

To summarize, we provide, in particular, adding to the resist applied on the individual faces as a dielectric in the method of producing an optoelectronic lamp device a reflective and/or scattering substance, in particular a white reflecting and/or white scattering substance such as $TiO_2$, for example, and/or respectively using a reflective and/or scattering resist, in particular a white reflecting and/or white scattering resist. The substance comprises scattering particles, in particular.

This advantageously increases efficiency of the lamp device since the light can be reflected and/or scattered by the top side of the resist layer. The efficiency is especially increased in an advantageous manner if a white reflecting and/or white scattering resist layer is involved here. This may also be advantageous for a color homogeneity. In particular, packages (lamp device) appearing white may thus be produced. Instead of white, a package appearing in a different color may be produced in accordance with the resist used. Production of the resist layer, which may also be referred to as a reflection and/or scattering layer, may advantageously be carried out in a process step that is already part of a process of producing or a method of producing an optoelectronic lamp device. Consequently, in an advantageous manner, no additional process step is necessary. That is to say in particular that a resist as described in the context of this description is now used in a method already known per se to produce an optoelectronic lamp device. Furthermore, an optimum covering of the individual faces to be coated may be achieved with a very high accuracy by the coating process with the resist.

Although our devices and methods have been more specifically illustrated and described in detail by the preferred examples, nevertheless this disclosure is not restricted by the examples disclosed and other variations may be derived therefrom by those skilled in the art, without departing from the scope of the appended claims.

This application claims priority of DE 10 2015 110 429.6, the subject matter of which is incorporated herein by reference.

The invention claimed is:

1. An optoelectronic lamp device comprising:
an optoelectronic semiconductor component comprising a top side comprising a light-emitting face,
a housing embedding the optoelectronic semiconductor component and leaving free the light-emitting face, and
an electrical plated-through hole,
wherein a housing face is coated with a light-scattering dielectric resist layer that scatters light incident on a face of the light-scattering dielectric resist layer facing away from the housing face,
a burr is formed at an edge of the top side of the optoelectronic semiconductor component, said burr being coated with the light-scattering dielectric resist layer,
the electrical plated-through hole runs from a top side of the housing to an underside of the housing situated opposite to the top side and is embedded in the housing,
said electrical plated-through hole comprising a top side partly coated by the light-scattering dielectric resist layer,
an underside situated opposite the top side of the electrical plated-through hole, and an electrical contact pad is configured at the top side of the electrical plated-through hole, the electrical contact pad being free of the light scattering dielectric resist layer and electrically connected to an electrical contact pad configured at the top side of the optoelectronic semiconductor component.

2. The optoelectronic lamp device according to claim 1, wherein the light-scattering dielectric resist layer comprises a plurality of scattering particles.

3. The optoelectronic lamp device according to claim 2, wherein the scattering particles comprise one or more elements selected from the group consisting of $TiO_2$ particles, $Al_2O_3$ particles, $SiO_2$ particles, $BaSO_4$ particles, $ZrO_2$ particles and $HfO_2$ particles.

4. The optoelectronic lamp device according to claim 1, wherein the light-scattering dielectric resist layer is configured such that scattered light is white.

5. The optoelectronic lamp device according to claim 1, wherein an electrical connection is arranged on the light-scattering dielectric light-scattering dielectric resist layer, and the burr is electrically insulated from the electrical connection.

6. The optoelectronic lamp device according to claim 5, wherein the electrical connection electrically connects the plated-through hole to the optoelectronic semiconductor component.

7. The optoelectronic lamp device according to claim 5, wherein the electrical connection is a metallization.

8. The optoelectronic lamp device according to claim 1, wherein a section of the top side of the optoelectronic semiconductor component, which section is configured differently from the light-emitting face is coated with the light-scattering dielectric resist layer.

9. The optoelectronic lamp device according to claim 1, wherein the light-scattering dielectric resist layer is a patterned light-scattering dielectric resist layer or a photolithographically patterned light-scattering dielectric resist layer.

* * * * *